United States Patent
Kwon et al.

(10) Patent No.: US 11,228,331 B2
(45) Date of Patent: Jan. 18, 2022

(54) LOW-POWER DOUBLE-QUADRATURE RECEIVER

(71) Applicant: KNU-INDUSTRY COOPERATION FOUNDATION, Chuncheon-si (KR)

(72) Inventors: Kuduck Kwon, Seoul (KR); Beomyu Park, Hongcheon-gun (KR)

(73) Assignee: KNU-INDUSTRY COOPERATION FOUNDATION, Chuncheon- si (KR)

( * ) Notice: Subject to any disclaimer, the term of this patent is extended or adjusted under 35 U.S.C. 154(b) by 0 days.

(21) Appl. No.: 16/929,618

(22) Filed: Jul. 15, 2020

(65) Prior Publication Data

US 2021/0119658 A1    Apr. 22, 2021

(51) Int. Cl.
*H04B 1/16* (2006.01)
*H03F 3/45* (2006.01)

(52) U.S. Cl.
CPC .......... *H04B 1/16* (2013.01); *H03F 3/45475* (2013.01); *H03F 2200/336* (2013.01); *H03F 2200/451* (2013.01)

(58) Field of Classification Search
CPC . H04B 1/16; H03F 3/45475; H03F 2200/336; H03F 2200/451
USPC .......................................................... 455/326
See application file for complete search history.

(56) References Cited

U.S. PATENT DOCUMENTS

| 5,448,772 A | * | 9/1995 | Grandfield | ........... | H03D 7/1425 327/357 |
| 7,847,613 B1 | * | 12/2010 | Samavati | ............. | H03B 5/1228 327/359 |
| 2010/0080270 A1 | * | 4/2010 | Chen | ....................... | H03F 1/223 375/219 |

* cited by examiner

*Primary Examiner* — Lee Nguyen
(74) *Attorney, Agent, or Firm* — Bond Schoeneck & King, PLLC; George McGuire

(57) ABSTRACT

A low-power double-quadrature receiver is disclosed. The double-quadrature receiver includes a quadrature signal generator configured to generate a first quadrature signal and a second quadrature signal based on each component of a differential input signal, and a switching stage configured to perform down-conversion on the first quadrature signal and the second quadrature signal.

20 Claims, 6 Drawing Sheets

-- PRIOR ART --

-- PRIOR ART --

LOW-POWER DOUBLE-QUADRATURE RECEIVER

CROSS-REFERENCE TO RELATED APPLICATION(S)

This application claims the priority benefit of Korean Patent Application No. 10-2019-0130202 filed on Oct. 18, 2019, in the Korean Intellectual Property Office, the disclosure of which is incorporated herein by reference for all purposes.

BACKGROUND

1. Field

One or more example embodiments relate to a low-power double-quadrature receiver.

2. Description of Related Art

In a communication system, a signal to be transmitted may be processed by a radio frequency (RF) device before the transmission, and a signal received may also be processed by the RF device after the reception. The RF device may perform digital processing generally in a baseband, that is, a frequency band of a signal before offsetting for the transmission at a carrier frequency. In general, a baseband signal may include a zero frequency component, for example, a direct current (DC) component. The baseband signal may be generally represented by an in-phase and quadrature-phase representation, for example, a complex representation. The processing may include filtering, modulation, demodulation, coding, and decoding. It is generally required to convert signals for transmission and reception in an analog domain, and convert signals at suitable RFs for a wireless system.

For a general-type receiver for wireless communications, a structure of the receiver including a low-noise transconductor (LNGM), a current-mode passive mixer, and a transimpedance amplifier (TIA) is widely used. However, such a structure may not be suitable for designing a low-power receiver because each block consumes power.

SUMMARY

An aspect provides a quadrature receiver in which a radio frequency (RF) block and a baseband block share a single supply voltage and bias current, thereby reducing power consumption and improving image rejection.

According to an example embodiment, there is provided a double-quadrature receiver including a quadrature signal generator configured to generate a first quadrature signal and a second quadrature signal based on each component of a differential input signal, and a switching stage configured to perform down-conversion on the first quadrature signal and the second quadrature signal.

The double-quadrature receiver may further include a first amplifier configured to amplify the differential input signal and output the amplified differential input signal to the quadrature signal generator, and a second amplifier configured to convert an output signal of the switching stage to a voltage signal and output the voltage signal.

The first amplifier, the quadrature signal generator, and the second amplifier may share at least one of a supply voltage or a bias current.

The quadrature signal generator may include a first quadrature signal generator configured to generate the first quadrature signal based on a first component of the differential input signal, and a second quadrature signal generator configured to generate the second quadrature signal based on a second component of the differential input signal.

The first amplifier may include a low-noise amplifier (LNA) or a low-noise transconductance amplifier (LNTA).

The second amplifier may include a baseband transimpedance amplifier (TIA) (baseband TIA).

Each of the first quadrature signal generator and the second quadrature signal generator may include an in-phase signal generator and a quadrature-phase signal generator.

The in-phase signal generator may include a resistor of which one end is grounded, an N-type metal-oxide-semiconductor field-effect transistor (n-MOSFET) of which a gate is connected to the other end of the resistor, and a capacitor of which one end is connected to the other end of the resistor and the gate of the n-MOSFET and the other end is connected to a source of the n-MOSFET.

The quadrature-phase signal generator may include a capacitor of which one end is grounded, an n-MOSFET of which a gate is connected to the other end of the capacitor, and a resistor of which one end is connected to the other end of the capacitor and the gate of the n-MOSFET and the other end is connected to a source of the n-MOSFET.

The source of the n-MOSFET of the in-phase signal generator and the source of the n-MOSFET of the quadrature-phase signal generator may be connected to each other.

The second amplifier may include an in-phase signal amplifier configured to amplify an in-phase signal and a quadrature-phase amplifier configured to amplify a quadrature-phase signal.

The switching stage may include a quadrature local oscillator (LO) configured to perform a double-quadrature function.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the present disclosure will become apparent and more readily appreciated from the following description of example embodiments, taken in conjunction with the accompanying drawings of which.

DETAILED DESCRIPTION

Figure 1:
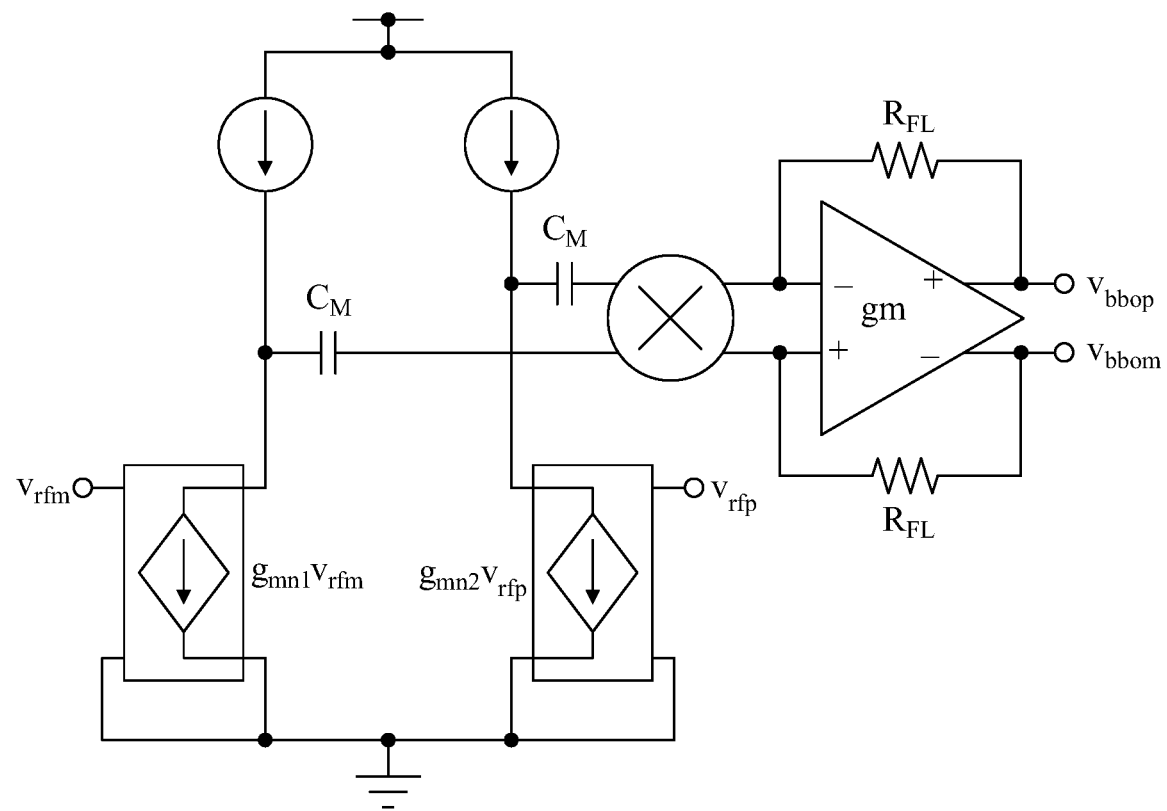
FIGS. 1 and 2 are diagrams illustrating examples of an existing receiver for wireless communications.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Also, in the description of embodiments, detailed description of well-known related structures or functions will be omitted when it is deemed that such description will cause ambiguous interpretation of the present disclosure.

Figure 2:
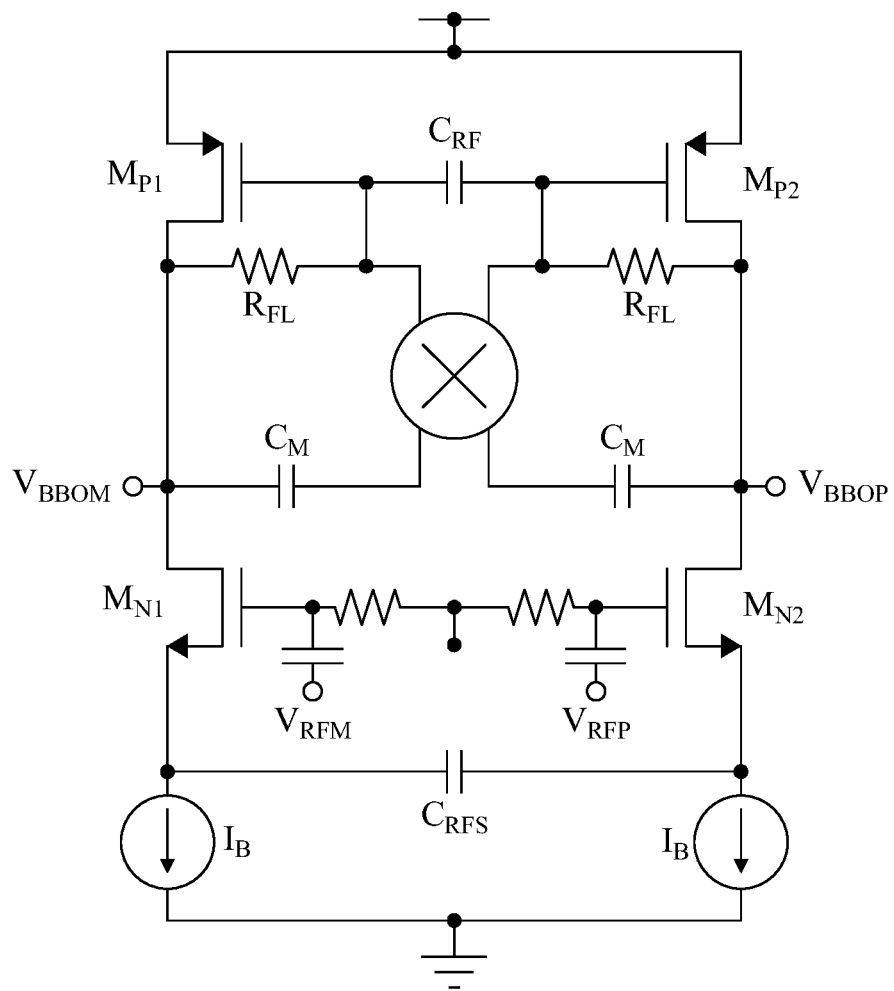

FIGS. 1 and 2 are diagrams illustrating examples of an existing receiver for wireless communications.

Referring to FIG. 1, a front-end structure of a receiver includes a low-noise transconductor (LNGM), a current-mode passive mixer, and a transimpedance amplifier (TIA). The receiver illustrated in FIG. 1 may consume power individually by each block, and thus may not be suitable for the design of a receiver that requires low power.

Referring to FIG. 2, a receiver includes a front-end structure in which a radio frequency (RF) block and a baseband block share a bias current. For example, the receiver may reduce power consumption as an LNGM, a current-mode passive mixer, and a TIA which is a baseband block share a bias current. However, the receiver illustrated in FIG. 2 is of a single quadrature structure using a quadrature local oscillator (LO) signal, and may not be suitable to be used without a change in design in a situation requiring a high level of image rejection, for example, 30 decibels (dB) or higher.

Figure 3:
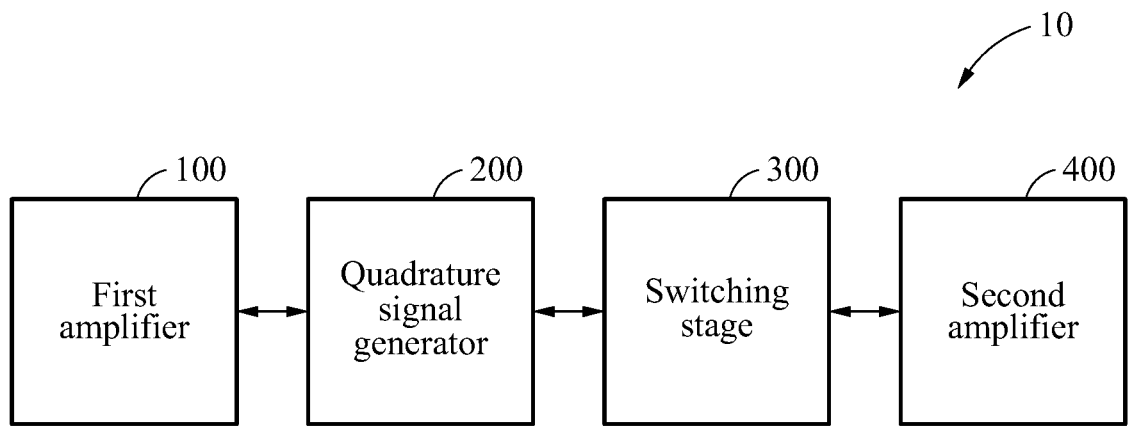
FIG. 3 is a diagram illustrating an example of a double-quadrature receiver according to an example embodiment.
Figure 4:
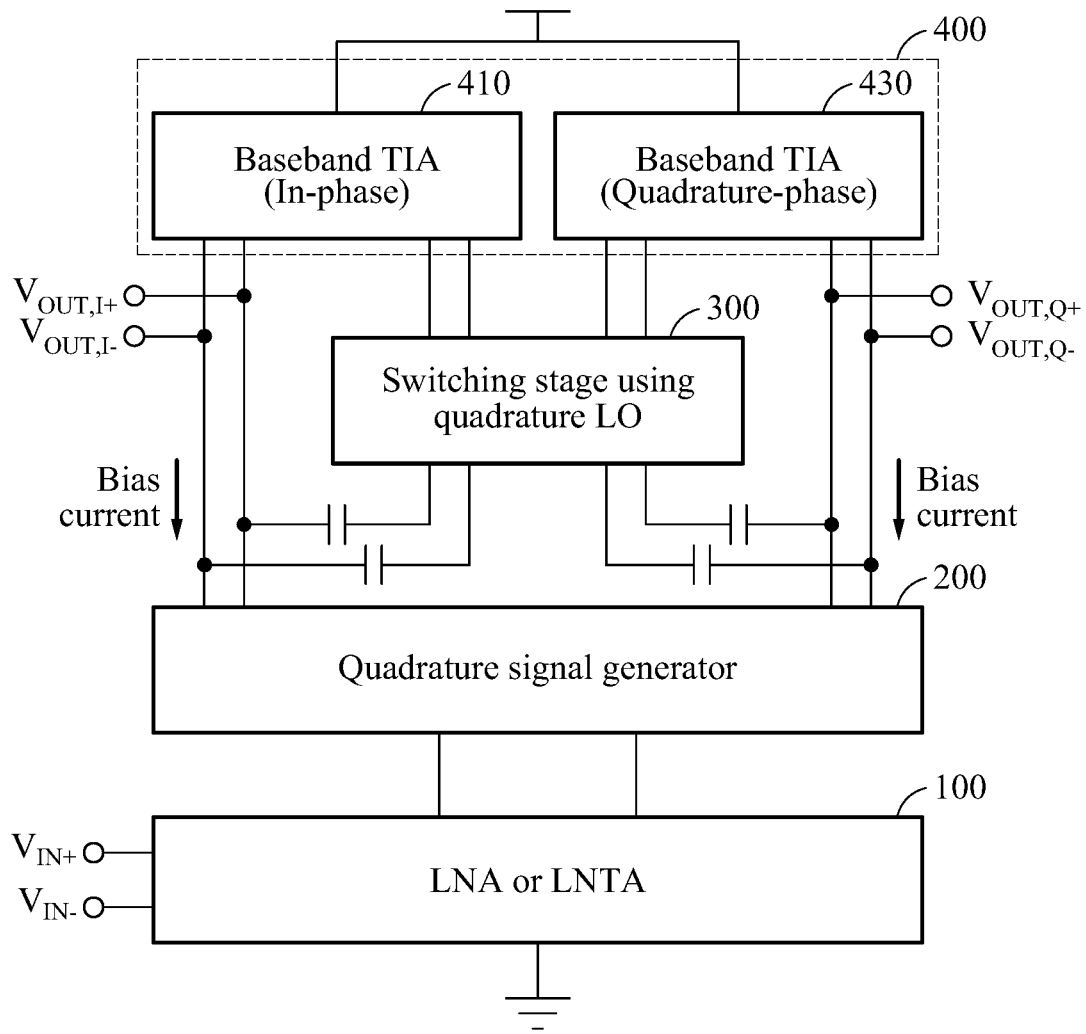
FIG. 4 is a detailed diagram illustrating the double-quadrature receiver of FIG. 3.

FIG. 3 is a diagram illustrating an example of a double-quadrature receiver according to an example embodiment. FIG. 4 is a detailed diagram illustrating the double-quadrature receiver of FIG. 3.

A double-quadrature receiver 10 may perform double-quadrature mixing. For example, the double-quadrature receiver 10 may perform the double-quadrature mixing while consuming a reduced amount of power as an RF block and a baseband block share a single supply voltage and bias current.

The double-quadrature receiver 10 may perform the double-quadrature mixing by consuming low power, and provide a high level of image rejection.

Referring to FIG. 3, the double-quadrature receiver 10 includes a first amplifier 100, a quadrature signal generator 200, a switching stage 300, and a second amplifier 400.

The first amplifier 100 may amplify an input signal and input the amplified signal to the quadrature signal generator 200. The input signal may be a differential input signal in the form of a current or a voltage.

The first amplifier 100 may be embodied by a low-noise amplifier (LNA) and/or a low-noise transconductance amplifier (LNTA).

The quadrature signal generator 200 may generate a quadrature signal based on the differential input signal. For example, the quadrature signal generator 200 may generate the quadrature signal based on the differential signal amplified by the first amplifier 100. In this example, the quadrature signal may be a signal in the form of a current.

The quadrature signal generator 200 may generate a first quadrature signal and a second quadrature signal based on each component of the differential input signal.

The switching stage 300 may perform the double-quadrature mixing, or a double-quadrature function.

The switching stage 300 may perform down-conversion on the quadrature signal. For example, the switching stage 300 may perform the down-conversion on each of the first quadrature signal and the second quadrature signal.

The switching stage 300 may perform the down-conversion on the quadrature signal using a quadrature LO of a current-mode mixer.

The second amplifier 400 may convert an output signal of the switching stage 300 to a voltage signal and output the voltage signal. For example, the second amplifier 400 may convert (and amplify) the signal obtained by the down-conversion in the switching stage 300 to the voltage signal, and output the voltage signal.

The second amplifier 400 may be embodied by a baseband TIA.

The second amplifier 400 includes an in-phase signal amplifier configured to convert (and amplify) an in-phase signal, and a quadrature-phase amplifier configured to convert (and amplify) a quadrature-phase signal.

The first amplifier 100, the quadrature signal generator 200, and/or the second amplifier 400 may share a supply voltage and/or bias current.

Figure 5:
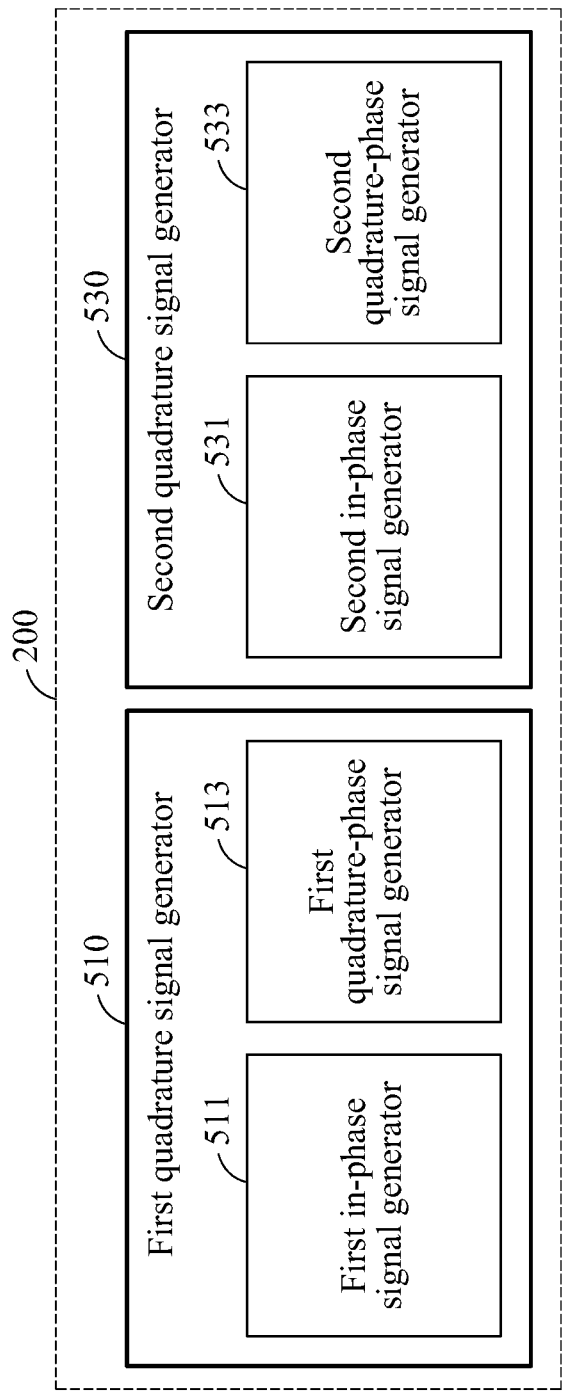
FIG. 5 is a diagram illustrating a quadrature signal generator of the double-quadrature receiver of FIG. 3.

FIG. 5 is a diagram illustrating the quadrature signal generator 200 of the double-quadrature receiver 10 of FIG. 3.

Referring to FIG. 5, the quadrature signal generator 200 includes a first quadrature signal generator 510 and a second quadrature signal generator 530.

The first quadrature signal generator 510 may generate a first quadrature signal based on a first component VIN+ of a differential input signal. The first quadrature signal may include a first in-phase signal II+ and a first quadrature-phase signal IQ+.

The first quadrature signal generator 510 includes a first in-phase signal generator 511 and a first quadrature-phase signal generator 513.

The in-phase signal generator 511 may generate the first in-phase signal $I_{I+}$ based on the first component $V_{IN+}$ of the differential input signal. For example, the first in-phase signal generator 511 may generate the first in-phase signal $I_{I+}$ that is represented by Equation 1 below.

$$I_{I+} = -\frac{1}{1+sR_0C_0}g_m V_{IN+} \quad \text{[Equation 1]}$$

The first quadrature-phase signal generator 513 may generate the first quadrature-phase signal $I_{Q+}$ based on the first component $V_{IN+}$ of the differential input signal. For example, the first quadrature-phase signal generator 513 may generate the first quadrature-phase signal $I_{Q+}$ that is represented by Equation 2 below.

$$I_{Q+} = -\frac{sR_0C_0}{1+sR_0C_0}g_m V_{IN+} \quad \text{[Equation 2]}$$

The second quadrature signal generator 530 may generate a second quadrature signal based on a second component $V_{IN-}$ of the differential input signal. The second quadrature signal may include a second in-phase signal and a second quadrature-phase signal $I_{Q-}$.

The second quadrature signal generator 530 includes a second in-phase signal generator 531 and a second quadrature-phase signal generator 533.

The second in-phase signal generator 531 may generate the second in-phase signal $I_{I-}$ based on the second component $V_{IN-}$ of the differential input signal. For example, the second in-phase signal generator 531 may generate the second in-phase signal $I_{I-}$ that is represented by Equation 3 below.

$$I_{I-} = -\frac{1}{1+sR_0C_0}g_m V_{IN-} \quad \text{[Equation 3]}$$

The second quadrature-phase signal generator 533 may generate the second quadrature-phase signal $I_{Q-}$ based on the second component $V_{IN-}$ of the differential input signal. For example, the second quadrature-phase signal generator 533 may generate the second quadrature-phase signal $I_{Q-}$ that is represented by Equation 4 below.

$$I_{Q-} = -\frac{sR_0C_0}{1+sR_0C_0}g_m V_{IN-} \quad \text{[Equation 4]}$$

Under the condition that $wR_0C_0=1$, the first in-phase signal $I_{Q+}$ and the second in-phase signal $I_{I-}$ may become the same in magnitude as the first quadrature-phase signal $I_{Q+}$ and the second quadrature-phase signal $I_{Q-}$, respectively, and have a phase difference of 90 degrees (°) therebetween.

Figure 6:
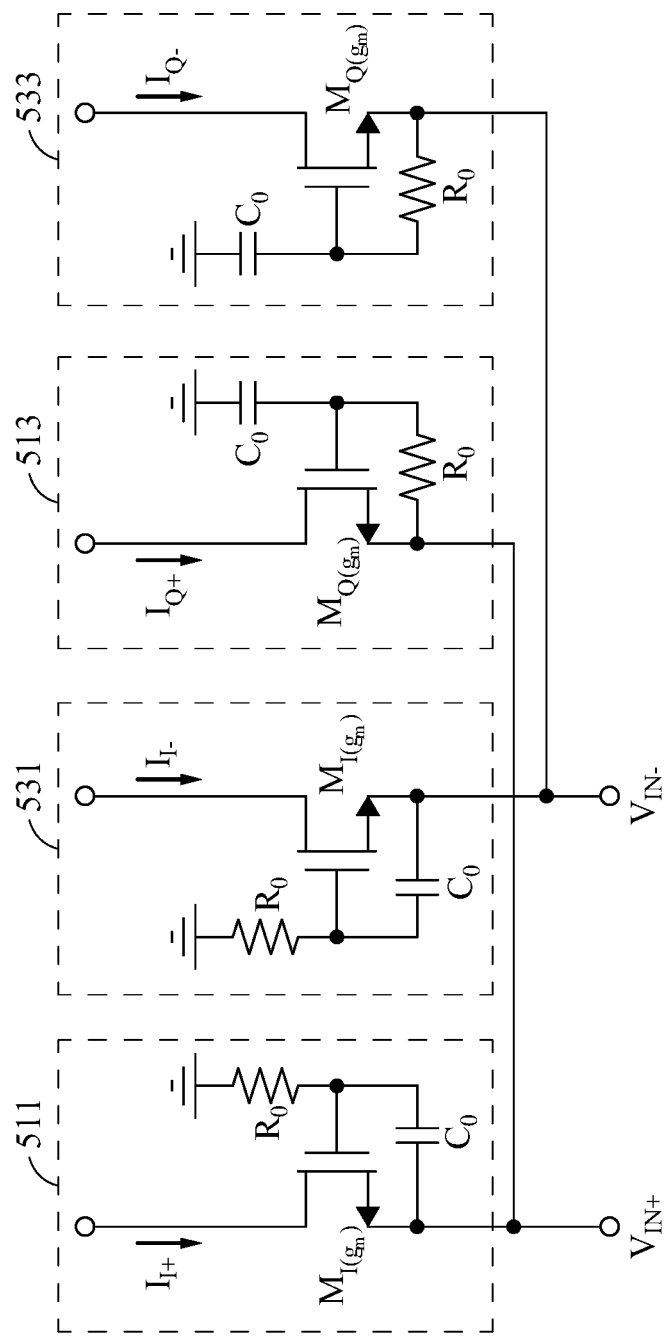
FIG. 6 is a circuit diagram of a quadrature signal generator of the double-quadrature receiver of FIG. 3.

FIG. 6 is a circuit diagram of the quadrature signal generator 200 of the double-quadrature receiver 10 of FIG. 3.

The first in-phase signal generator 511 and the first quadrature-phase signal generator 513 may be embodied by a circuit of the same structure as the second in-phase signal generator 531 and the second quadrature-phase signal generator 533, respectively.

Hereinafter, for the convenience of description of the circuit structure, the first in-phase signal generator 511 and the second in-phase signal generator 531 will be referred to as an in-phase signal generator, and the first quadrature-phase signal generator 513 and the second quadrature-phase signal generator 533 will be referred to as a quadrature-phase signal generator.

The in-phase signal generator includes a resistor $R_0$, an N-type metal-oxide-semiconductor field-effect transistor (n-MOSFET) $M_{I(g_m)}$, and a capacitor $C_0$.

One end of the resistor $R_0$ may be grounded, and the other end thereof may be connected to a gate of the n-MOSFET $M_{I(g_m)}$.

One end of the capacitor $C_0$ may be connected to the resistor $R_0$ and the gate of the n-MOSFET $M_{I(g_m)}$, and the other end thereof may be connected to a source of the n-MOSFET $M_{I(g_m)}$.

At a drain of the n-MOSFET $M_{I(g_m)}$, in-phase signals $I_{I+}$ and $I_{I-}$ may be generated.

The quadrature-phase signal generator includes a capacitor C0, an n-MOSFET $M_{I(g_m)}$, and a resistor R0.

One end of the capacitor C0 may be grounded, and the other end thereof may be connected to a gate of the n-MOSFET $M_{Q(g_m)}$.

One end of the resistor R0 may be connected to the capacitor C0 and the gate of the –MOSFET $M_{Q(g_m)}$ and the other end thereof may be connected to a source of the n-MOSFET $M_{Q(g_m)}$.

At a drain of the n-MOSFET $M_{Q(g_m)}$, quadrature-phase signals IQ+ and IQ– may be generated.

Figure 7:
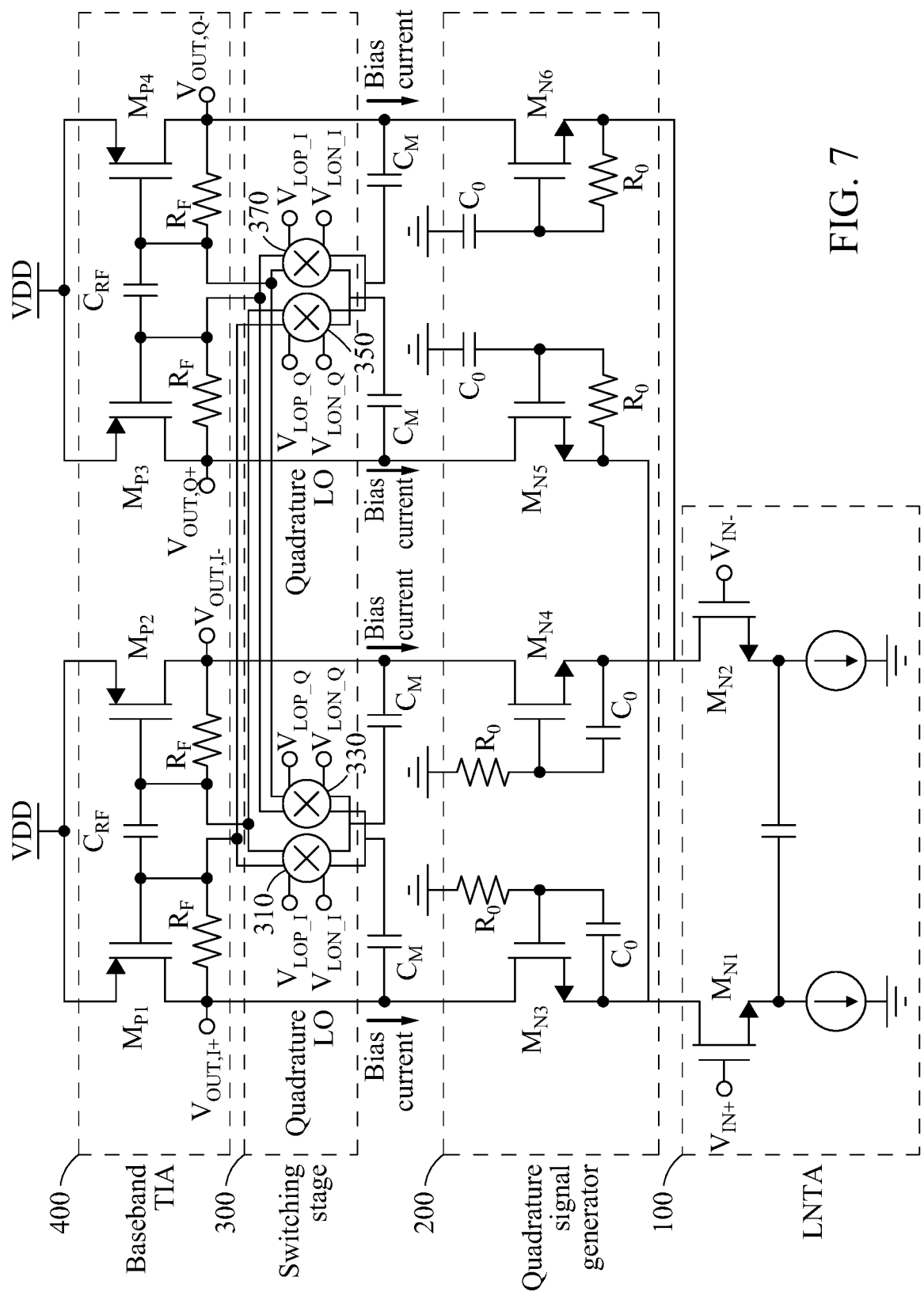
FIG. 7 is a circuit diagram of the double-quadrature receiver of FIG. 3.

FIG. 7 is a circuit diagram of the double-quadrature receiver 10 of FIG. 3.

Referring to FIG. 7, the double-quadrature receiver 10 includes the first amplifier 100, the quadrature signal generator 200, the switching stage 300, and the second amplifier 400.

The first amplifier 100 may be embodied by an LNTA 100 as illustrated, and includes an n-MOSFET MN1 and an n-MOSFET MN2, a first current source, a second current source, and a capacitor.

A first component VIN+ and a second component VIN– of a differential input signal may be input to a gate of the n-MOSFET MN1 and a gate of the n-MOSFET MN2, respectively.

One end of the first current source and one end of the second current source may be connected to a source of the n-MOSFET MN1 and a source of the n-MOSFET MN2, respectively. Both ends of the capacitor may be connected to the source of the n-MOSFET MN1 and the source of the n-MOSFET MN2, respectively.

The other end of the first current source and the other end of the second current source may be grounded.

The LNTA 100 may be connected to the quadrature signal generator 200 through a drain of the n-MOSFET MN1 and a drain of the n-MOSFET MN2. For example, the drain of the n-MOSFET MN1 may be connected to the first in-phase signal generator 511 and the first quadrature-phase signal generator 513, and the drain of the n-MOSFET MN2 may be connected to the second in-phase signal generator 531 and the second quadrature-phase signal generator 533.

The quadrature signal generator 200 may be connected to the switching stage 300 through drains of n-MOSFETs MN3, MN4, MN5, and MN6 of the first in-phase signal generator 511, the second in-phase signal generator 531, the first quadrature-phase signal generator 513, and the second quadrature-phase signal generator 533.

The drains of the n-MOSFETs MN3, MN4, MN5, and MN6 of the first in-phase signal generator 511, the second in-phase signal generator 531, the first quadrature-phase signal generator 513, and the second quadrature-phase signal generator 533 may be connected to one ends of respective capacitors CM, and to respective output terminals VOUT,I+, VOUT,I−, VOUT,Q+, and VOUT,Q−.

The switching stage 300 includes a first quadrature mixer 310, a second quadrature mixer 330, a third quadrature mixer 350, and a fourth quadrature mixer 370. The first through the fourth quadrature mixers 310 through 370 may be a double-balanced mixer.

Quadrature LO signals VLOP,I and VLON,I may be connected to a gate of the first quadrature mixer 310 and a gate of the fourth quadrature mixer 370. Quadrature LO signals VLOP,Q and VLON,Q may be connected to a gate of the second quadrature mixer 330 and a gate of the third quadrature mixer 350.

Respective sources of the first through the fourth quadrature mixers 310 through 370 may be connected to the other ends of the capacitors CM, respectively.

The second amplifier 400 may be embodied by a baseband TIA 400 as illustrated. The baseband TIA 400 includes a first voltage source, a second voltage source, P-type MOSFETs (p-MOSFETs) MP1, MP2, MP3, and MP4, a capacitor CRF, and a resistor RF.

Respective sources of the p-MOSFETs MP1 and MP2 may be connected to the first voltage source, and respective sources of the p-MOSFETs MP3 and MP4 may be connected to the second voltage source.

Respective gates of the p-MOSFETs MP1 and MP2 may be connected to both ends of a first capacitor CRF, and respective gates of the p-MOSFETs MP3 and MP4 may be connected to both ends of a second capacitor CRF.

The gates of the p-MOSFETs MP1 and MP2 may be connected to a drain of the first quadrature mixer 310 and a drain of the third quadrature mixer 350. The gates of the p-MOSFETs MP3 and MP4 may be connected to a drain of the second quadrature mixer 330 and a drain of the fourth quadrature mixer 370.

Respective drains of the p-MOSFETs MP1, MP2, MP3, and MP4 may be connected to output terminals VOUT,I+, VOUT,I−, VOUT,Q+, and VOUT,Q−, respectively.

Here, between the gates of the p-MOSFETs MP1, MP2, MP3, and MP4, and the output terminals VOUT,I+, VOUT,I−, VOUT,Q+, and VOUT,Q−, the resistor RF may be connected.

As described above, the double-quadrature receiver 10 may perform double-quadrature mixing by consuming low power and provide a high level of image rejection, and thus be applied to RF integrated circuit (RFIC) design for the Internet of things (IoT) application fields that require low power, for example, BLE, Zigbee, NB-IoT, LTE-M, and wifi-ah.

The units described herein may be implemented using hardware components and software components. For example, the hardware components may include microphones, amplifiers, band-pass filters, audio to digital convertors, non-transitory computer memory and processing devices. A processing device may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums. The non-transitory computer readable recording medium may include any data storage device that can store data which can be thereafter read by a computer system or processing device.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A double-quadrature receiver comprising:
a quadrature signal generator configured to generate a first quadrature signal and a second quadrature signal based on each component of a differential input signal; and
a switching stage configured to perform down-conversion on the first quadrature signal and the second quadrature signal;
wherein the quadrature signal generator includes:
a first quadrature signal generator configured to generate the first quadrature signal based on a first component of the differential input signal, the first quadrature signal generator comprising an in-phase signal generator and a quadrature-phase signal generator; and
a second quadrature signal generator configured to generate the second quadrature signal based on a second component of the differential input signal, the second quadrature signal generator comprising an in-phase signal generator and a quadrature-phase signal generator; and,
wherein each of the in-phase signal generators comprise:
a resistor of which one end is grounded;
an N-type metal-oxide-semiconductor field-effect transistor (n-MOSFET) of which a gate is connected to the other end of the resistor; and
a capacitor of which one end is connected to the other end of the resistor and the gate of the n-MOSFET, and the other end is connected to a source of the n-MOSFET.

2. The double-quadrature receiver of claim 1, further comprising:
a first amplifier configured to amplify the differential input signal and output the amplified differential input signal to the quadrature signal generator; and
a second amplifier configured to convert an output signal of the switching stage to a voltage signal and output the voltage signal.

3. The double-quadrature receiver of claim 2, wherein the first amplifier, the quadrature signal generator, and the second amplifier share at least one of a supply voltage or a bias current.

4. The double-quadrature receiver of claim 2, wherein the first amplifier comprises:
a low-noise amplifier (LNA) or a low-noise transconductance amplifier (LNTA).

5. The double-quadrature receiver of claim 2, wherein the second amplifier comprises:
a baseband transimpedance amplifier (TIA) (baseband TIA).

6. The double-quadrature receiver of claim 2, wherein the second amplifier comprises:
an in-phase signal amplifier configured to amplify an in-phase signal; and
a quadrature-phase amplifier configured to amplify a quadrature-phase signal.

7. The double-quadrature receiver of claim 1, wherein the switching stage comprises:
a quadrature local oscillator configured to perform a double-quadrature function.

8. A double-quadrature receiver comprising:
a quadrature signal generator configured to generate a first quadrature signal and a second quadrature signal based on each component of a differential input signal; and
a switching stage configured to perform down-conversion on the first quadrature signal and the second quadrature signal;
wherein the quadrature signal generator includes:
a first quadrature signal generator configured to generate the first quadrature signal based on a first component of the differential input signal, the first quadrature signal generator comprising an in-phase signal generator and a quadrature-phase signal generator; and
a second quadrature signal generator configured to generate the second quadrature signal based on a second component of the differential input signal, the second quadrature signal generator comprising an in-phase signal generator and a quadrature-phase signal generator; and,
wherein each of the quadrature-phase signal generators comprise:
a capacitor of which one end is grounded;
an n-MOSFET of which a gate is connected to the other end of the capacitor; and
a resistor of which one end is connected to the other end of the capacitor and the gate of the n-MOSFET, and the other end is connected to a source of the n-MOSFET.

9. The double-quadrature receiver of claim 8, further comprising:
a first amplifier configured to amplify the differential input signal and output the amplified differential input signal to the quadrature signal generator; and
a second amplifier configured to convert an output signal of the switching stage to a voltage signal and output the voltage signal.

10. The double-quadrature receiver of claim 9, wherein the first amplifier, the quadrature signal generator, and the second amplifier share at least one of a supply voltage or a bias current.

11. The double-quadrature receiver of claim 9, wherein the first amplifier comprises:
a low-noise amplifier (LNA) or a low-noise transconductance amplifier (LNTA).

12. The double-quadrature receiver of claim 9, wherein the second amplifier comprises:
a baseband transimpedance amplifier (TIA) (baseband TIA).

13. The double-quadrature receiver of claim 9, wherein the second amplifier comprises:
an in-phase signal amplifier configured to amplify an in-phase signal; and
a quadrature-phase amplifier configured to amplify a quadrature-phase signal.

14. The double-quadrature receiver of claim 8, wherein the switching stage comprises:
a quadrature local oscillator configured to perform a double-quadrature function.

15. A double-quadrature receiver comprising:
a quadrature signal generator configured to generate a first quadrature signal and a second quadrature signal based on each component of a differential input signal; and
a switching stage configured to perform down-conversion on the first quadrature signal and the second quadrature signal;
wherein the quadrature signal generator includes:
a first quadrature signal generator configured to generate the first quadrature signal based on a first component of the differential input signal, the first quadrature signal generator comprising an in-phase signal generator and a quadrature-phase signal generator; and a second quadrature signal generator configured to generate the second quadrature signal based on a second component of the differential input signal, the second quadrature signal generator comprising an in-phase signal generator and a quadrature-phase signal generator;

wherein a source of an n-MOSFET of the in-phase signal generator and a source of an n-MOSFET of the quadrature-phase signal generator are connected to each other.

16. The double-quadrature receiver of claim 15, further comprising:
   a first amplifier configured to amplify the differential input signal and output the amplified differential input signal to the quadrature signal generator; and
   a second amplifier configured to convert an output signal of the switching stage to a voltage signal and output the voltage signal.

17. The double-quadrature receiver of claim 16, wherein the first amplifier, the quadrature signal generator, and the second amplifier share at least one of a supply voltage or a bias current.

18. The double-quadrature receiver of claim 16, wherein the first amplifier comprises:
   a low-noise amplifier (LNA) or a low-noise transconductance amplifier (LNTA).

19. The double-quadrature receiver of claim 16, wherein the second amplifier comprises:
   a baseband transimpedance amplifier (TIA) (baseband TIA).

20. The double-quadrature receiver of claim 16, wherein the second amplifier comprises:
   an in-phase signal amplifier configured to amplify an in-phase signal; and
   a quadrature-phase amplifier configured to amplify a quadrature-phase signal.

* * * * *